United States Patent [19]

Tomoyori et al.

[11] Patent Number: 4,805,983
[45] Date of Patent: Feb. 21, 1989

[54] LED ARRAY HEAD

[75] Inventors: Makoto Tomoyori; Shinji Murata, both of Iwate, Japan

[73] Assignee: Alps Electric Co., Ltd., Japan

[21] Appl. No.: 98,782

[22] Filed: Sep. 21, 1987

[30] Foreign Application Priority Data

Nov. 27, 1986 [JP] Japan ............................ 61-182594[U]

[51] Int. Cl.⁴ ................................................. G02B 6/04
[52] U.S. Cl. ................................ 350/96.24; 350/96.25
[58] Field of Search ............... 350/96.24, 96.25, 96.26; 355/1

[56]     References Cited
U.S. PATENT DOCUMENTS 3,630,612  12/1971  Lehovec ............................ 350/96.25
4,435,064  3/1984  Tsukada et al. ........................ 355/1

Primary Examiner—William L. Sikes
Assistant Examiner—Robert E. Wise
Attorney, Agent, or Firm—Guy W. Shoup; Paul J. Winters; Brian D. Ogonowsky

[57]      ABSTRACT

Disclosed is here an LED array head in which a light emitting section thereof is selectively caused to emit light to expose an object to the light wherein a fiber bundle constituted with a plurality of optical fibers is arranged with an end portion thereof to be located at a position in the vicinity of the light emitting section and another end portion of the fiber bundle is formed to have a curved surface, which is brought into contact with the object.

3 Claims, 2 Drawing Sheets ated using 4,805,983

LED ARRAY HEAD

BACKGROUND OF THE INVENTION

1. Field of the Invention

The present invention relates to an LED array head for use with an apparatus such as an LED printer using an electro-photography process.

2. Description of the Prior Art

The prior art LED array head will be described with reference to FIG. 6.

In FIG. 6, the structure includes a ceramic substrate 1 on which an LED chip 2 is disposed by the die bonding and wire bonds 3 are disposed in the LED chip 2 for each light emitting section 2a so as to supply electric power thereto. Above the light emitting section 2a of the LED chip 2, there is arranged a rod lens array 4 of the self-convergence type retained by a mechanism not shown, thereby collecting the light radiated from the light emitting section 2a onto such an object 5 to be exposed to the light as a photosensitive drum.

However, in the LED array head of the prior art, since the rod lens array of the self-convergence type 4 is used, the distance between the light emitting section 2a and the object 5 to be exposed to the light is determined by the focal length of the rod lens array of the self-convergence type 4 and is hence quite long.

In addition, only a portion of the light radiated from the light emitting section 2a reaches the rod lens array of the self-convergence type 4 and the efficiency of light transmission to the object 5 is not satisfactory; consequently, in order to increase the quantity of light, a great energy is required to radiate light to be supplied to the LED chip 2.

SUMMARY OF THE INVENTION

It is therefore an object of the present invention to provide a small-sized LED array which does not require such a large energy to radiate light, thereby removing the problem described above.

The representative feature of the present invention resides in that a fiber bundle including a plurality of optical fibers is arranged with an end portion thereof located at a position in the neighborhood of a light emitting section and that another end portion of the fiber bundle is formed to have a curved surface.

Since the fiber bundle including a plurality of optical fibers is arranged with an end portion thereof located at a position in the neighborhood of a light emitting section, a substantial portion of the light radiated from the light emitting section enters the fiber bundle and hence is efficiently transmitted to the object to be exposed to the light.

Moreover, since another end portion of the fiber bundle is formed to have a curved surface, the end portion is smoothly brought into contact with the object, which prevents the object from being damaged.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Referring now to FIGS. 1–4, an embodiment of the present invention will be described.

Incidentally, FIGS. 1–4 respectively show a side view of an embodiment, a perspective view of a fiber array plate, a partial cross-sectional view of the fiber array plate, and a cross-sectional view of optical fiber.

Figure 1:
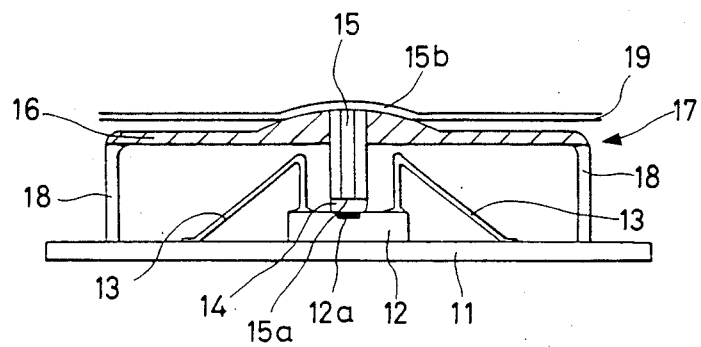
FIG. 1 is a side view schematically illustrating an embodiment of the present invention.

In FIG. 1, the structure includes a ceramic substrate 11 on which an LED chip 12 is disposed by the die bonding and wire bonds 13 are disposed in the LED chip 12 for each light emitting section 12a so as to supply electric power thereto. Above the light emitting section 12a of the LED chip 12, there is provided via a transparent synthetic resin layer 14 a fiber bundle 15 with an end portion 15a thereof located in the vicinity of the light emitting section 12a. Moreover, another end portion 15b of the fiber bundle 15 is formed to have a curved surface having a protruded portion in a center portion thereof. In addition, the fiber bundle 15 is retained by use of a base member 16 so that there is formed a fiber array plate 17 (to be described later) by use of the base member 16 and the fiber bundle 15. Reference numeral 18 indicates a spacer used to support the fiber array plate 17 on the ceramic substrate 11. Reference numeral 19 is such an object to be exposed to the light as a photosensitive belt arranged to be brought into contact with the curved surface of the another end portion 15b of the fiber bundle 15.

Figure 2:
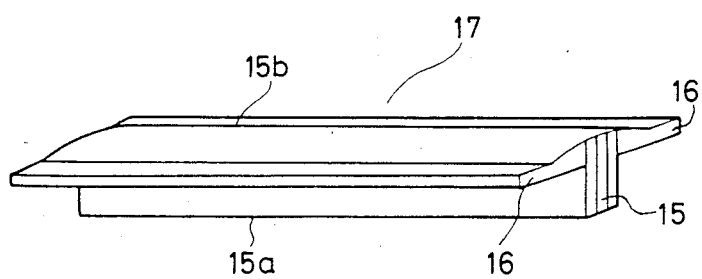
FIG. 2 is a perspective view depicting a fiber array plate.
Figure 3:
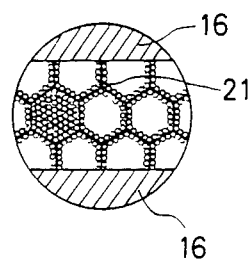
FIG. 3 is a partial cross-sectional view showing the fiber array plate.
Figure 4:
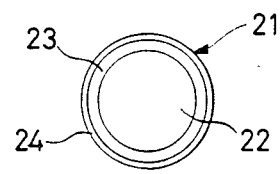
FIG. 4 is a cross-sectional view illustrating an optical fiber.

Next, the fiber array plate 17 will be described in detail. As shown in FIG. 2, in a base member 16 made of a glass, a synthetic resin, or the like having a rectangular form and a thickness of about 1 mm, there is buried therein a fiber bundle 15 in the longitudinal direction thereof. Incidentally, the fiber bundle 15 is, as shown in FIG. 3, of a construction in which a plurality of optical fibers 21 each having a diameter of 10–25 μm (to be described later) are gathered. Moreover, the optical fiber 21 has a 3-layer structure comprising, as shown in FIG. 4, a core 22 made of a glass having a large value of the refractive index, a clad 23 manufactured with a glass having a small value of the refractive index in the periphery of the core 22, and an absorber 24 made of carbon and the like in the periphery of the clad 23.

A description will be given of an LED array head described above. In FIG. 1, the light radiated from the light emitting section 12a of the LED chip 12 entirely passes through the transparent synthetic resin 14 and enters the fiber bundle 15 via the end portion 15a. The light is transmitted through the fiber bundle with a transmission efficiency of at least 90% and is radiated from the another end 15b onto the object 19 to be exposed to the light. Incidentally, since the end portion 15b of the fiber bundle 15 is brought into contact with the object 19, the light radiated from the end portion 15b of the fiber bundle is entirely used to irradiate the object 19.

Figure 5:
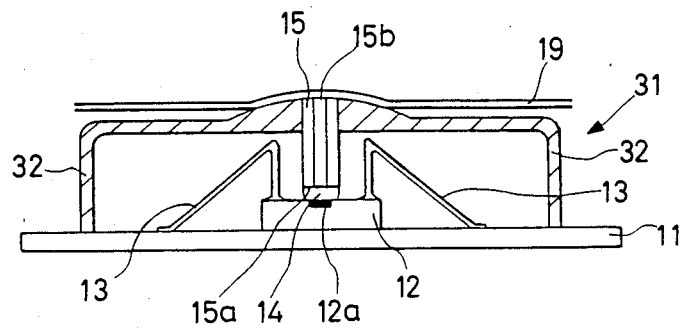
FIG. 5 is a side view depicting another embodiment of the present invention.
Figure 6:
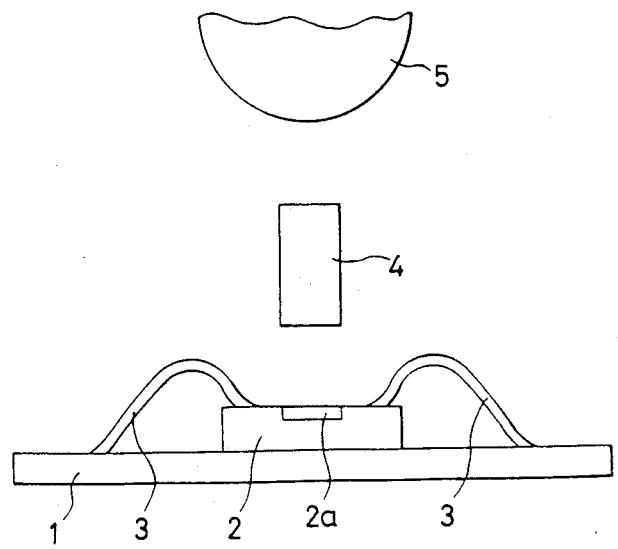
FIG. 6 is a side view showing a prior art example.

Next referring to FIG. 5, another embodiment of the present invention will be described. Here, the components of the embodiment of FIG. 5 which are same as those of FIG. 2 will be assigned with the same reference numerals and the description thereof will be omitted.

The representative feature of this embodiment resides in a fiber array plate 31. The fiber array plate 31 includes a fiber bundle 15 identical to that of the embodiment of FIG. 2 and a base member 32 which has a cross section having a shape similar to the combination of base member 16 and spacer 18 in FIG. 1 to bury and to retain the fiber bundle 15. Hence the base member 32 can be mounted on the ceramic substrate 11 without using spacers.

It is to be appreciated that the present invention is not restricted by those embodiments, which can be modified in various fashions, for example, to retain the fiber array plates 17 and 31 with a member other than the ceramic substrate 11.

According to the present invention having the configuration and operations as described above, the following effects will be obtained.

(1) Since the resolution developed on the surface of the object to be exposed to the light is known to be independent of the thickness of the fiber plate, the thickness can be reduced to the possible extent in the range allowable with respect to the strength of the fiber plate and hence the distance between the light emitting section and the object can be minimized, which enables to miniaturize the apparatus.

(2) Due to the satisfactory light collecting efficiency, the energy to emit light to be supplied to the LED chip can be reduced, which enables to minimize the capacity of the power source driving the LED array and further to elongate the life of the LED array.

(3) Since this configuration unnecessitates the focusing operation which has been required for the rod lens array of the self-convergence type, the assemblage of the system is facilitated.

(4) Because the end portion of the fiber bundle is formed to have a curved surface, the fiber bundle is smoothly brought into contact with the object, which prevents the object from being damaged.

While the present invention has been described with reference to the particular illustrative embodiments, it is not restricted by those embodiments but only by the appended claims. It is to be appreciated that those skilled in the art can modify and change the embodiments without departing from the scope and spirit of the invention.

What is claimed is:

1. An LED array head in which a light emitting section thereof is selectively caused to emit light to expose an object to the light wherein
   a fiber bundle comprising a plurality of optical fibers providing substantially no optical convergence is arranged with an end portion thereof to be located at a position in the vicinity of the light emitting section and wherein
   another end portion of the fiber bundle is formed to have a curved surface.

2. An LED array head according to claim 1 wherein the object is brought into contact with the curved surface of said end portion of the fiber bundle.

3. An LED array head according to claim 2 wherein said curved surface is a convex surface and said object is a photosensitive belt.

* * * * *